US012446417B2

(12) United States Patent
Park et al.

(10) Patent No.: US 12,446,417 B2
(45) Date of Patent: Oct. 14, 2025

(54) DISPLAY DEVICE INCLUDING INTERSECTING SCAN LINES

(71) Applicant: Samsung Display Co., LTD., Yongin-si (KR)

(72) Inventors: Ju Chan Park, Seoul (KR); Sun Ho Kim, Seongnam-si (KR); Gun Hee Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 672 days.

(21) Appl. No.: 17/528,169

(22) Filed: Nov. 16, 2021

(65) Prior Publication Data

US 2022/0310760 A1 Sep. 29, 2022

(30) Foreign Application Priority Data

Mar. 24, 2021 (KR) ........................ 10-2021-0037997

(51) Int. Cl.

| | |
|---|---|
| ***H10K 59/131*** | (2023.01) |
| ***G09G 3/00*** | (2006.01) |
| ***H10K 59/121*** | (2023.01) |

(52) U.S. Cl.

CPC ............ *H10K 59/131* (2023.02); *G09G 3/00* (2013.01); *H10K 59/1213* (2023.02); *H10K 59/1216* (2023.02)

(58) Field of Classification Search

CPC ............ H10K 59/131; H10K 59/1213; H10K 59/1216; H10K 59/352; H10K 59/353; H10K 59/88; H10K 59/12; G09G 3/00; G09G 3/20; G09G 3/3225; G09G 3/3266; G09G 3/3275; G09G 2330/028; G09F 9/30

See application file for complete search history.

(56) References Cited

U.S. PATENT DOCUMENTS

| | | | | |
|---|---|---|---|---|
| 10,147,777 | B2 | 12/2018 | Lim et al. | |
| 2010/0053042 | A1 | 3/2010 | Kajiyama et al. | |
| 2015/0325593 | A1* | 11/2015 | Shih | H01L 27/0292 345/206 |
| 2019/0035876 | A1* | 1/2019 | Kim | H10K 59/88 |
| 2019/0073976 | A1* | 3/2019 | Yeh | G09G 3/3666 |
| 2020/0058722 | A1 | 2/2020 | Li | |

FOREIGN PATENT DOCUMENTS

| | | | |
|---|---|---|---|
| CN | 107632477 | A | 1/2018 |
| JP | 2010060648 | A | 3/2010 |
| KR | 101773934 | | 9/2017 |
| KR | 1020170122911 | | 11/2017 |
| KR | 1020180003371 | | 1/2018 |
| KR | 1020180055004 | | 5/2018 |
| KR | 101902500 | | 10/2018 |

* cited by examiner

*Primary Examiner* — Pegeman Karimi

(74) *Attorney, Agent, or Firm* — CANTOR COLBURN LLP

(57) ABSTRACT

A display device includes a substrate, a plurality of scan lines disposed on the substrate, a plurality of data lines and a plurality of dummy data lines intersecting the scan lines, a plurality of first pixel circuit units connected to the scan lines and the plurality of data lines, a first light-emitting element connected to the first pixel circuit unit, a plurality of second pixel circuit units connected to the scan lines and the plurality of dummy data lines, and a second light-emitting element connected to the second pixel circuit unit, where at least one of a plurality of scan lines intersects another adjacent scan line.

22 Claims, 11 Drawing Sheets

DISPLAY DEVICE INCLUDING INTERSECTING SCAN LINES

This application claims priority to Korean Patent Application No. 10-2021-0037997 filed on Mar. 24, 2021, and all the benefits accruing therefrom under 35 U. S. C. § 119, the content of which in its entirety is herein incorporated by reference.

BACKGROUND

1. Field

Embodiments of the invention relate to a display device.

2. Description of the Related Art

A display device is a device for displaying an image, and includes a liquid crystal display ("LCD"), an organic light emitting diode ("OLED") display, and the like. The display device is used in various electronic devices such as a mobile phone, a navigation device, a digital camera, an electronic book, a portable game machine, and various terminals.

The display device may include a display area in which a screen is displayed and a peripheral area in which the screen is not displayed. In the display area, a plurality of pixels may be disposed in a row direction and a column direction. Within each pixel, various elements such as transistors, capacitors, etc., and various wires that may supply signals to the various elements may be positioned. In the peripheral area, various wires, scan drivers, data drivers, and controllers that transmit electrical signals to drive the plurality of pixels may be positioned.

SUMMARY

There is an increasing demand to reduce a size of the peripheral area and enlarge the display area, but there is a problem that it is difficult to reduce the size of the peripheral area as the area occupied by the driving unit is increasing in a process of implementing high resolution and high speed driving.

Embodiments are to provide a display device of which the display area is expanded.

A display device in an embodiment includes a substrate, a plurality of scan lines disposed on the substrate, a plurality of data lines and a plurality of dummy data lines intersecting the plurality of scan lines, a plurality of first pixel circuit units connected to the plurality of scan lines and the plurality of data lines, a first light-emitting element connected to a first pixel circuit unit of the plurality of first pixel circuit units, a plurality of second pixel circuit units connected to the plurality of scan lines and the plurality of dummy data lines, and a second light-emitting element connected to a second pixel circuit unit of the plurality of second pixel circuit units, where at least one of a plurality of scan lines intersect another adjacent scan line of the plurality of scan lines.

In an embodiment, the substrate may include a display area and a peripheral area, the display area includes a first display area and a second display area disposed between the first display area and the peripheral area, the first pixel circuit unit and the first light-emitting element may be disposed in the first display area, and the second pixel circuit unit and the second light-emitting element may be disposed in the second display area.

In an embodiment, the display device may further include a driving circuit unit generating and transmitting a signal for driving the first light-emitting element and the second light-emitting element, at least a part of the driving circuit unit may be disposed in the second display area, and a remaining part of the driving circuit unit is disposed in the peripheral area.

In an embodiment, the second light-emitting element may overlap the driving circuit unit.

In an embodiment, a light emission region of the first light-emitting element may overlap the first pixel circuit unit connected thereto, and a light emission region of at least one second light-emitting element of a plurality of second light-emitting elements may not overlap the second pixel circuit unit connected thereto.

In an embodiment, a light emission region of at least one second light-emitting element of the plurality of second light-emitting elements may overlap the second pixel circuit unit that is not connected thereto.

In an embodiment, the driving circuit unit may include a scan driver, a data driver, a driving voltage supply line, and a common voltage supply line, and the scan driver may be disposed in the second display area.

In an embodiment, the plurality of scan lines may extend in a first direction, the plurality of data lines and the plurality of dummy data lines may extend in a second direction intersecting the first direction, and the first pixel circuit unit and the second pixel circuit unit may be disposed in a matrix form along the first direction and the second direction.

In an embodiment, the plurality of scan lines may include a first scan line, a second scan line, a third scan line, and a fourth scan line, the first scan line may be connected to a first pixel circuit unit disposed in a first row among the plurality of first pixel circuit units and a second pixel circuit unit disposed in the first row among the plurality of second pixel circuit units, the second scan line may be connected to a first pixel circuit unit disposed in a second row among the plurality of first pixel circuit units and a second pixel circuit unit disposed in the second row among the plurality of second pixel circuit units, the third scan line may be connected to a first pixel circuit unit disposed in a third row among the plurality of first pixel circuit units and a second pixel circuit unit disposed in a fourth row among the plurality of second pixel circuit units, and the fourth scan line may be connected to a first pixel circuit unit disposed in the fourth row among the plurality of first pixel circuit units and a second pixel circuit unit disposed in the third row among the plurality of second pixel circuit units.

In an embodiment, the third scan line and the fourth scan line may intersect each other at a boundary between the first display area and the second display area.

In an embodiment, the third scan line may include a first portion disposed in the first display area, a second portion disposed in the second display area, and a connection portion connecting the first portion and the second portion, and the connection portion of the third scan line may overlap the fourth scan line at the intersection of the third scan line and the fourth scan line.

In an embodiment, the first portion and second portion of the third scan line may be disposed in a same layer as the fourth scan line, and the connection portion of the third scan line may be disposed in a different layer from the fourth scan line.

In an embodiment, the plurality of scan lines may include a first scan line, a second scan line, a third scan line, and a fourth scan line, the first scan line may be connected to a first pixel circuit unit disposed in a first row among the plurality of first pixel circuit units and a second pixel circuit unit disposed in a second row among the plurality of second pixel circuit units, the second scan line may be connected to a first pixel circuit unit disposed in the second row among the plurality of first pixel circuit units and a second pixel circuit unit disposed in the first row among the plurality of second pixel circuit units, the third scan line may be connected to a first pixel circuit unit disposed in a third row among the plurality of first pixel circuit units and a second pixel circuit unit disposed in the third row among the plurality of second pixel circuit units, and the fourth scan line may be connected to a first pixel circuit unit disposed in a fourth row among the plurality of first pixel circuit units and a second pixel circuit unit disposed in the fourth row among the plurality of second pixel circuit units.

In an embodiment, the first scan line and the second scan line may intersect each other at a boundary between the first display area and the second display area.

In an embodiment, a size of the second light-emitting element may be larger than a size of the first light-emitting element, and an area of the second pixel circuit unit may be larger than an area of the first pixel circuit unit.

In an embodiment, the size of the second light-emitting element is twice the size of the first light-emitting element, and the area of the second pixel circuit unit may be twice the area of the first pixel circuit unit.

A display device in an embodiment includes a substrate including a first display area, a peripheral area, and a second display area disposed between the first display area and the peripheral area, a first scan line and a second scan line disposed on the substrate, a first pixel circuit unit disposed in the first display area and connected to the first scan line or the second scan line, and a second pixel circuit unit disposed in the second display area and connected to the first scan line or the second scan line, where the first pixel circuit unit connected to the first scan line is disposed on a same row as the second pixel circuit unit connected to the second scan line, and the first pixel circuit unit connected to the second scan line is disposed on a same row as the second pixel circuit unit connected to the first scan line.

In an embodiment, the first scan line and the second scan line may intersect each other at a boundary between the first display area and the second display area.

In an embodiment, the display device may further include a first light-emitting element connected to the first pixel circuit unit, and a second light-emitting element connected to the second pixel circuit unit, a light emission region of the first light-emitting element may overlap the first pixel circuit unit connected thereto, and a light emission region of the second light-emitting element may not overlap the second pixel circuit unit connected thereto.

In an embodiment, the display device may further include a driving circuit unit generating and transmitting a signal for driving the first light-emitting element and the second light-emitting element, and the second light-emitting element may overlap the driving circuit unit.

In an embodiment, the display device having an extended display area may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings.

DETAILED DESCRIPTION

Figure 1:
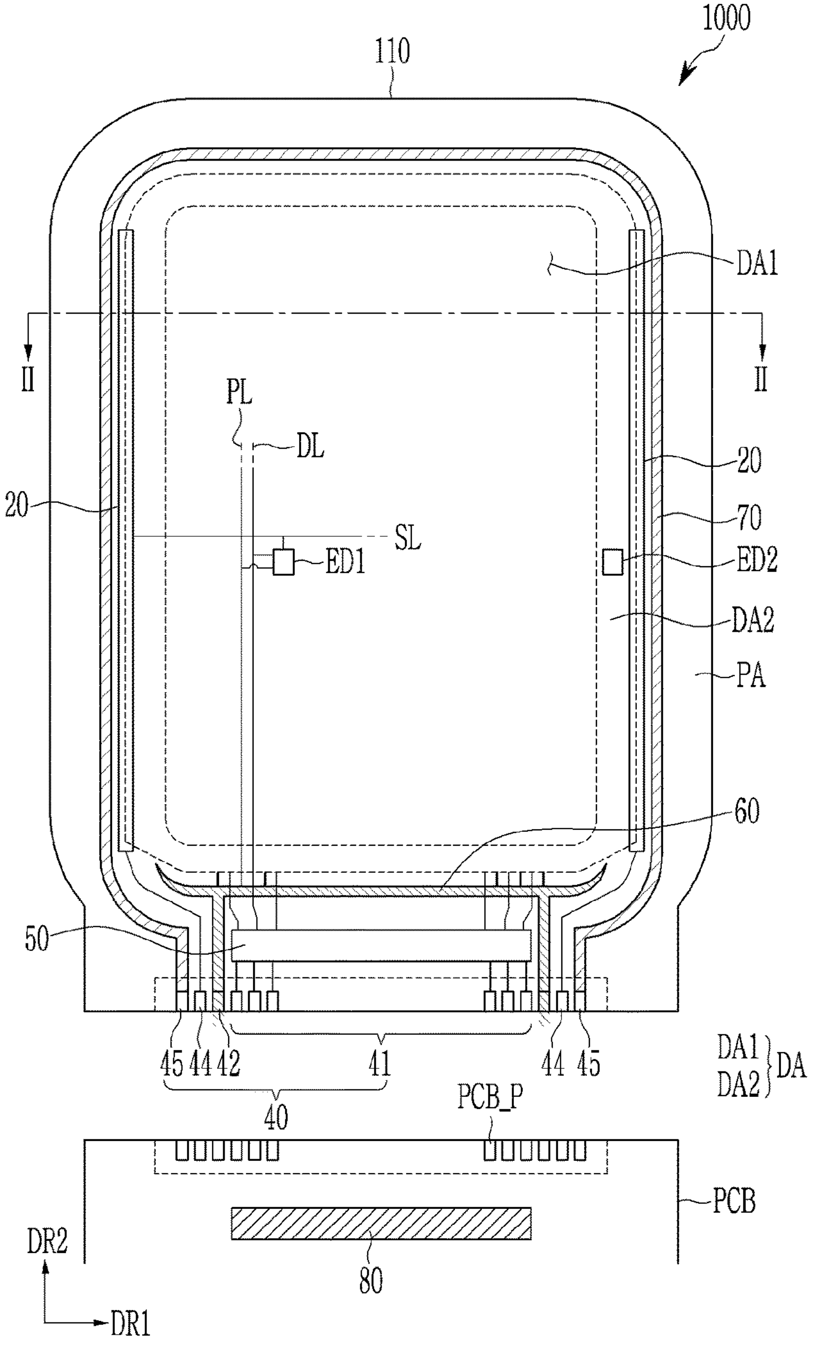
FIG. 1 is a schematic top plan view of an embodiment of a display device.

The invention will be described more fully hereinafter with reference to the accompanying drawings, in which embodiments of the invention are shown. As those skilled in the art would realize, the described embodiments may be modified in various different ways, all without departing from the spirit or scope of the invention.

The drawings and description are to be regarded as illustrative in nature and not restrictive, and like reference numerals designate like elements throughout the specification.

Further, since sizes and thicknesses of constituent members shown in the accompanying drawings are arbitrarily given for better understanding and ease of description, the invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein. A term such as "unit" may mean a circuit block which performs a predetermined function, for example.

Figure 2:
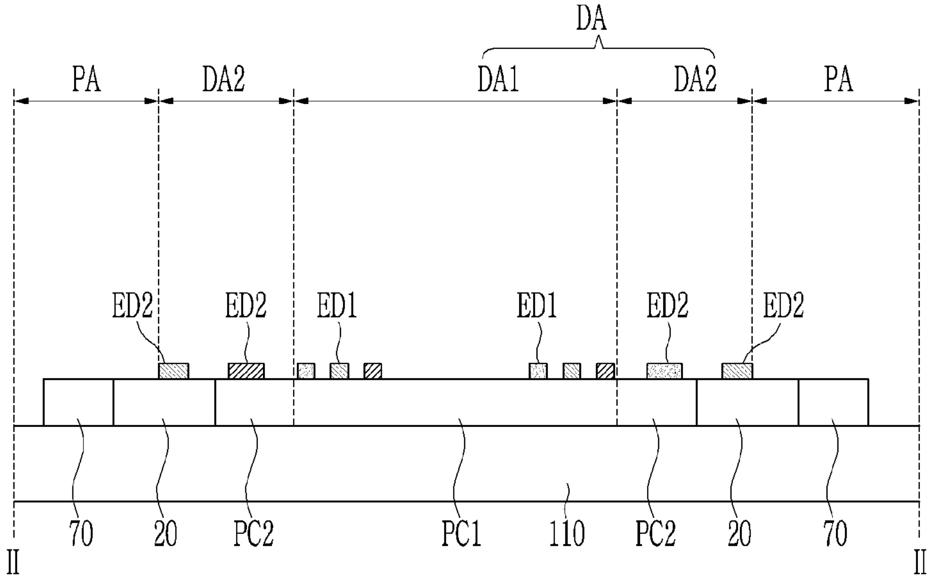
FIG. 2 is a cross-sectional view taken along line II-II of FIG. 1.

First, a display device in an embodiment is described with refence to FIG. 1 and FIG. 2.

FIG. 1 is a schematic top plan view of an embodiment of a display device, and FIG. 2 is a cross-sectional view taken along line II-II of FIG. 1.

As shown in FIG. 1 and FIG. 2, a display device 1000 in an embodiment includes a substrate 110 and light-emitting elements ED1 and ED2 disposed on the substrate 110.

The substrate 110 includes a display area DA and a peripheral area PA adjacent to the display area DA.

The display area DA may be disposed in a center portion of the display device 1000 and may have a substantially quadrangular (e.g., rectangular) shape, and each corner may have a rounded shape. The display area DA is an area that displays an image and may include a first display area DA1 and a second display area DA2.

The first display area DA1 may be disposed on the center portion of the display area DA and occupy most of the display area DA.

The second display area DA2 may be disposed adjacent to the first display area DA1. The second display area DA2 may be disposed to the left and right, that is, opposite sides of the first display area DA1. In addition, the second display area DA2 may be further disposed above and below the first display area DA1. However, it is not limited thereto, and the second display area DA2 may be disposed only on one side of the first display area DA1. The second display area DA2 may be disposed between the first display area DA1 and the peripheral area PA).

The peripheral area PA may be formed or provided with a shape surrounding the display area DA. The peripheral area PA is a region in which an image is not displayed and may be disposed on the outer side of the display device 1000.

The light-emitting elements ED1 and ED2 may be disposed on the display area DA of the substrate 110, and are electrically connected to a plurality of signal lines PL, DL, and SL. Each of the light-emitting elements ED1 and ED2 may emit red, green, blue, or white light. The display area DA may provide a predetermined image through light emitted from the light-emitting elements ED1 and ED2. The light-emitting elements ED1 and ED2 may include a first light-emitting element ED1 and a second light-emitting element ED2. The first light-emitting element ED1 may be disposed in the first display area DA1, and the second light-emitting element ED2 may be disposed in the second display area DA2.

The display device 1000 in an embodiment may further include pixel circuit units PC1 and PC2 disposed on the substrate 110. The pixel circuit units PC1 and PC2 may include a first pixel circuit unit PC1 and a second pixel circuit unit PC2. In FIG. 2, the first pixel circuit unit PC1 collectively represents a region in which a plurality of first pixel circuit units PC1 is arranged in a matrix form, and the second pixel circuit unit PC2 collectively represents a region in which a plurality of second pixel circuit units PC2 is arranged in a matrix form. An area occupied by a plurality of first pixel circuit units PC1 may be larger than an area occupied by a plurality of second pixel circuit units PC2. The pixel circuit units PC1 and PC2 may be respectively connected to the light-emitting elements ED1 and ED2. The first pixel circuit unit PC1 may be connected to the first light-emitting element ED1, and the second pixel circuit unit PC2 may be connected to the second light-emitting element ED2. The arrangement form of a plurality of pixel circuit units is not particularly limited, and they may be arranged in various forms. In an embodiment, a plurality of pixel circuit units is not crossed at right angles each other, but may be intersected in an inclined direction, for example.

The areas of one first pixel circuit unit PC1 and one second pixel circuit unit PC2 may be different from each other. In an embodiment, the lengths of the first pixel circuit unit PC1 and the second pixel circuit unit PC2 in a main extension direction may be the same as each other, and the widths of the first pixel circuit unit PC1 and the second pixel circuit unit PC2 in a direction perpendicular to the main extension direction may be different from each other, for example. In an alternative embodiment, the widths of the first pixel circuit unit PC1 and the second pixel circuit unit PC2 may be the same as each other, and the lengths of the first pixel circuit unit PC1 and the second pixel circuit unit PC2 may be different from each other. In an alternative embodiment, both the length and width of the first pixel circuit unit PC1 and the second pixel circuit unit PC2 may be different from each other. In this case, the area of the second pixel circuit unit PC2 may be larger than that of the first pixel circuit unit PC1 (refer to FIG. 3). In an embodiment, the area of the second pixel circuit unit PC2 may reach about twice the area of the first pixel circuit unit PC1, for example.

The display device 1000 in an embodiment may further include a driving circuit unit, and the driving circuit unit may include a plurality of driving units and signal wires. In an embodiment, the driving circuit unit may include a scan driver 20, a data driver 50, a driving voltage supply line 60, a common voltage supply line 70, and signal transmission wires connected to these, for example. At least a part of the driving circuit unit may be disposed in the second display area DA2, and the rest may be disposed in the peripheral area PA.

The scan driver 20 generates and transmits scan signals to the pixel circuit units PC1 and PC2, which are electrically connected to the light-emitting elements ED1 and ED2 through the scan line SL. In an embodiment, the scan driver 20 may be dispose on the left and right sides of the first display area DA1. The illustrated embodiment shows a structure in which the scan driver 20 is disposed on opposite sides of the substrate 110, but in another embodiment, the scan driver 20 may be disposed only on one side of the substrate 110.

A pad part 40 is disposed on one end of the substrate 110 and includes a plurality of terminals 41, 42, 44, and 45. The pad part 40 is exposed without being covered by an insulating layer and may be electrically connected to the printed circuit board PCB. The pad part 40 may be electrically connected to the pad part PCB P of the printed circuit board PCB. The printed circuit board PCB may transmit the signal or power of an integrated circuit ("IC") driving chip 80 to the pad part 40.

The IC driving chip (also referred to as a controller) 80 converts a plurality of image signals transmitted from the outside into a plurality of image data signals and transmits the converted signals to the data driver 50 through the terminal 41. In addition, the controller 80 may receive a vertical synchronization signal, a horizontal synchronizing signal, and a clock signal to generate control signals for controlling the driving of the scan driver 20 and the data driver 50 and transmit them to each of the terminals 44 and 41. The controller 80 transmits a driving voltage ELVDD to the driving voltage supply line 60 through the terminal 42. In addition, the controller 80 transmits the common voltage ELVSS to each of the common voltage supply lines 70 through the terminal 45.

The data driver 50 may be disposed on the peripheral area PA, and generates and transmits a data signal to the pixel circuit units PC1 and PC2 connected to each of the light-emitting elements ED1 and ED2 through the data line DL. The data driver 50 may be disposed on one side (e.g., lower side) of the substrate 110 and may be disposed between the pad part 40 and the display area DA for example.

The driving voltage supply line 60 may be disposed on the peripheral area PA. In an embodiment, the driving voltage supply line 60 may be disposed between the data driver 50 and the display area DA, for example. The driving voltage supply line 60 provides the driving voltage ELVDD to the pixel circuit units PC1 and PC2 respectively connected to the light-emitting elements ED1 and ED2. The driving voltage supply line 60 is disposed in the first direction DR1 and may be connected to a plurality of driving voltage lines PL disposed in the second direction DR2.

The common voltage supply line 70 may be disposed on the peripheral area PA. The common voltage supply line 70 may have a shape surrounding the substrate 110. The common voltage supply line 70 transmits a common voltage ELVSS to one electrode (e.g., a second electrode) of the light-emitting element ED1 and ED2. Although not shown in this specification, a dam disposed in the peripheral area PA may be further included.

The light-emitting elements ED1 and ED2 may be disposed on the first pixel circuit unit PC1 and the second pixel circuit unit PC2, respectively, and at least a part of the driving circuit unit.

The first pixel circuit unit PC1 may be electrically connected to the first light-emitting element ED1 disposed on the first pixel circuit unit PC1. The first pixel circuit unit PC1 and the first light-emitting element ED1 may be disposed in the first display area DA1. The region from which light is emitted by the first light-emitting element ED1 is the first display area DA1.

The second pixel circuit unit PC2 may be electrically connected to the second light-emitting element ED2. The region where light is emitted by the second light-emitting element ED2 is the second display area DA2. In the second display area DA2, the second light-emitting element ED2 electrically connected to the second pixel circuit unit PC2 and disposed on the second pixel circuit unit PC2 may be disposed. Also, in the second display area DA2, the second light-emitting element ED2 electrically connected to the second pixel circuit unit PC2 and disposed on the scan driver 20 may be disposed.

In a general display device, the light-emitting elements ED1 and ED2 are disposed on the pixel circuit units PC1 and PC2, and the light-emitting element is not disposed on the driving circuit unit. In an embodiment of the display device, the second light-emitting element ED2 not only overlaps the second pixel circuit unit PC2, but also overlaps the scan driver 20 of the driving circuit unit, thereby expanding a region in which a screen is displayed. In the above, it has been described that the second light-emitting element ED2 overlaps the scan driver 20, but is not limited thereto, and the second light-emitting element ED2 may overlap driving circuit units other than the scan driver 20.

Hereinafter, a connection relationship between each pixel circuit unit and light-emitting element of a display device in an embodiment is described with reference to FIG. 3 to FIG. 5.

Figure 3:
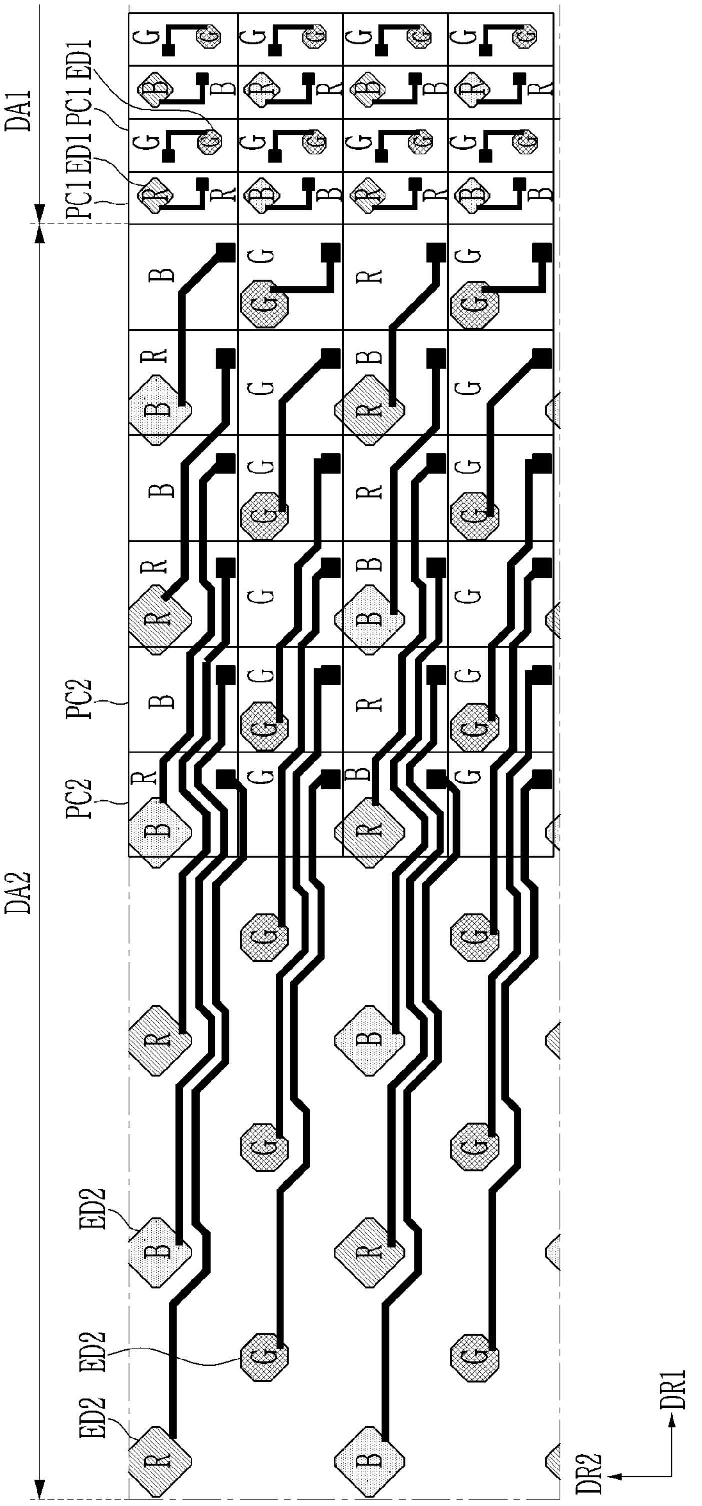
FIG. 3 is a view showing an embodiment of a connection relationship of a pixel circuit unit and a light-emitting element of a display device.
Figure 4:
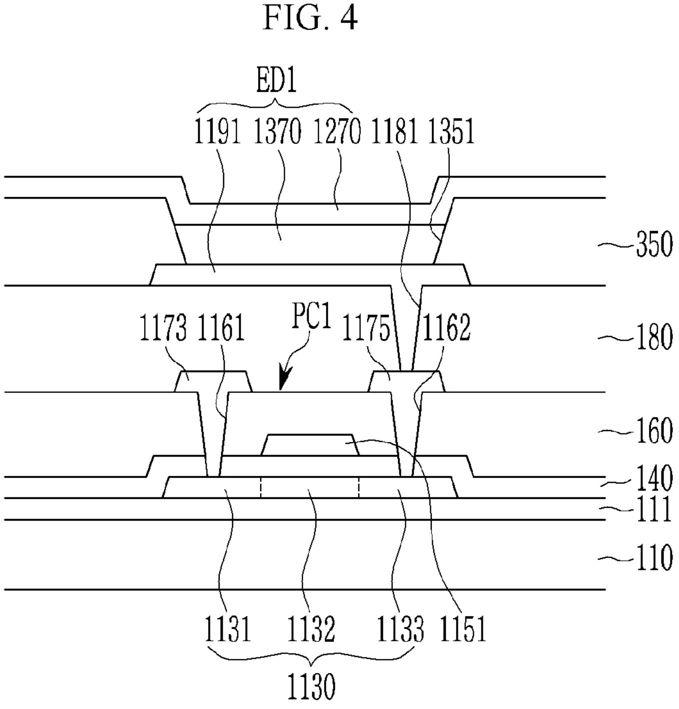
FIG. 4 is a cross-sectional view showing an embodiment of a first pixel circuit unit and a first light-emitting element of a display device.
Figure 5:
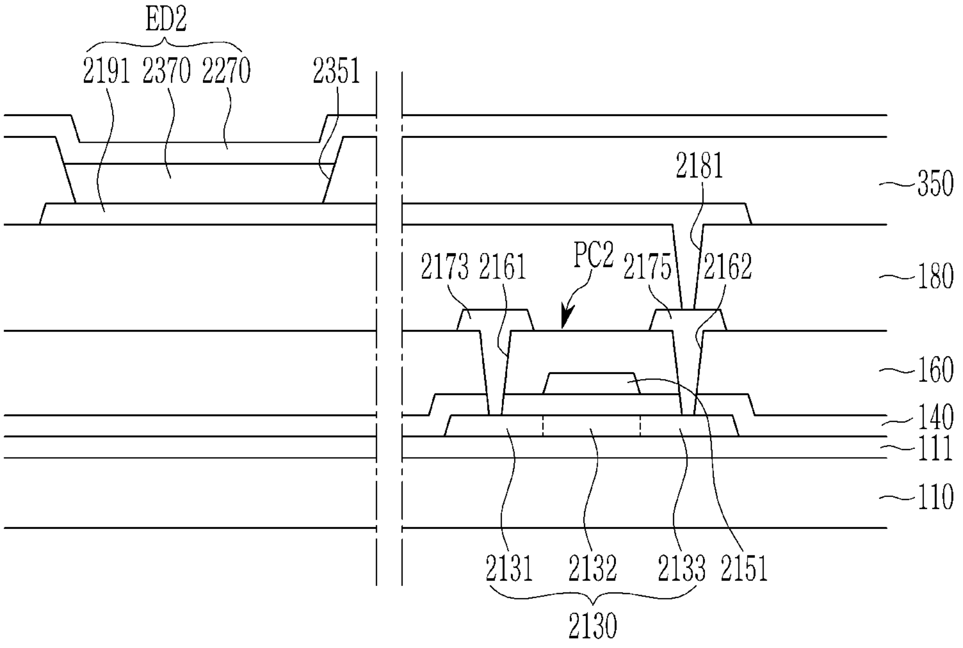
FIG. 5 is a cross-sectional view showing an embodiment of a second pixel circuit unit and a second light-emitting element of a display device.

FIG. 3 is a view showing an embodiment of a connection relationship of a pixel circuit unit and a light-emitting element of a display device, FIG. 4 is a cross-sectional view showing an embodiment of a first pixel circuit unit and a first light-emitting element of a display device, and FIG. 5 is a cross-sectional view showing an embodiment of a second pixel circuit unit and a second light-emitting element of a display device.

First, as shown in FIG. 3 and FIG. 4, the light emission region of the first light-emitting element ED1 of the display device in an embodiment overlaps the first pixel circuit unit PC1 connected to the first light-emitting element ED1.

The first pixel circuit unit PC1 may include a semiconductor 1130, a gate electrode 1151, a source electrode 1173, and a drain electrode 1175 disposed on the substrate 110.

The substrate 110 may include at least one among polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material capable of bending or folding, and may be single-layered or multi-layered.

A buffer layer 111 may be disposed on the substrate 110. The buffer layer 111 may have a single-layered or multi-layered structure. The buffer layer 111 may include an inorganic insulating material or an organic insulating material such as a silicon nitride (SiNx), a silicon oxide (SiOx), or a silicon oxynitride (SiOxNy). The buffer layer 111 may be omitted in some cases. In addition, a barrier layer may be further disposed between the substrate 110 and the buffer layer 111. The barrier layer may have a single-layered or multi-layered structure. The barrier layer may include an inorganic insulating material such as a silicon nitride (SiNx), a silicon oxide (SiOx), or a silicon oxynitride (SiOxNy).

A semiconductor layer including a semiconductor 1130 of the first pixel circuit unit PC1 may be disposed on the buffer layer 111. The semiconductor 1130 may include a first region 1131, a channel 1132, and a second region 1133. A first region 1131 and a second region 1133 may be disposed on opposite sides of a channel 1132 of the semiconductor 1130 of the first pixel circuit unit PC1. The semiconductor 1130 of the first pixel circuit unit PC1 may include a semiconductor material such as amorphous silicon, polysilicon, or an oxide semiconductor.

A gate insulating layer 140 may be disposed on the semiconductor 1130 of the first pixel circuit unit PC1. The gate insulating layer 140 may have a single-layered or multi-layered structure. The gate insulating layer 140 may include an inorganic insulating material such as a silicon nitride (SiNx), a silicon oxide (SiOx), or a silicon oxynitride (SiOxNy).

On the gate insulating layer 140, a gate conductive layer including a gate electrode 1151 of the first pixel circuit unit PC1 may be disposed. The gate electrode 1151 of the first pixel circuit unit PC1 may overlap the channel 1132 of the semiconductor 1130. The gate conductive layer may have a single-layered or multi-layered structure. The gate conductive layer may include a metal material such as molybdenum (Mo), aluminum (Al), copper (Cu), and/or titanium (Ti). After forming the gate conductive layer, a doping process or a plasma treatment may be performed. The part of the semiconductor layer that is covered by the gate conductive layer is not doped or plasma-treated, and the part of the semiconductor layer that is not covered by the first gate conductive layer is doped or plasma-treated so that it may have the same characteristic as a conductor.

An inter-insulating layer 160 may be disposed on the gate electrode 1151 of the first pixel circuit unit PC1. The inter-insulating layer 160 may have a single-layered or multi-layered structure. The inter-insulating layer 160 may include an inorganic insulating material or an organic insulating material.

A data conductive layer including a source electrode 1173 and a drain electrode 1175 of the first pixel circuit unit PC1 may be disposed on the inter-insulating layer 160. The data conductive layer may include aluminum (Al), platinum (Pt), palladium (Pd), silver (Ag), magnesium (Mg), gold (Au), nickel (Ni), neodymium Nd, iridium (Ir), chromium (Cr), nickel (Ni), calcium (Ca), molybdenum (Mo), titanium (Ti), tungsten (W), and/or copper (Cu).

An opening 1161 overlapping the source electrode 1173 of the first pixel circuit unit PC1 and the first region 1131 of the semiconductor 1130 may be defined in the inter-insulating layer 160. The source electrode 1173 of the first pixel circuit unit PC1 may be connected to the first region 1131 of the semiconductor 1130 through the opening 1161. An opening 1162 overlapping the drain electrode 1175 of the first pixel circuit unit PC1 and the second region 1133 of the semiconductor 1130 may be defined in the inter-insulating layer 160. The drain electrode 1175 of the first pixel circuit unit PC1 may be connected to the second region 1133 of the semiconductor 1130 through the opening 1162.

A passivation layer 180 may be disposed above the source electrode 1173 and the drain electrode 1175 of the first pixel circuit unit PC1. The passivation layer 180 may include an organic insulating material such as a general purpose polymer such as poly(methyl methacrylate) or polystyrene, a polymer derivative having a phenolic group, an acryl-based polymer, an imide polymer, a polyimide, an acryl-based polymer, or a siloxane-based polymer.

On the passivation layer 180, the first light-emitting element ED1 connected to the first pixel circuit unit PC1 may be disposed. The first light-emitting element ED1 may include a pixel electrode 1191, a light-emitting element layer 1370, and a common electrode 1270.

The pixel electrode 1191 of the first light-emitting element ED1 may be disposed above the passivation layer 180. An opening 1181 overlapping the pixel electrode 1191 and the drain electrode 1175 of the first pixel circuit unit PC1 may be defined in the passivation layer 180. The pixel electrode 1191 of the first light-emitting element ED1 may be connected to the drain electrode 1175 of the first pixel circuit unit PC1 through the opening 1181.

A partition wall 350 may be disposed above the pixel electrode 1191 of the first light-emitting element ED1. A pixel opening 1351 is defined in the partition wall 350, and the pixel opening 1351 of the partition wall 350 may overlap the pixel electrode 1191.

A light-emitting element layer 1370 may be disposed within the pixel opening 1351 of the partition wall 350. The light-emitting element layer 1370 may overlap the pixel electrode 1191.

A common electrode 1270 may be disposed on the light-emitting element layer 1370 and the partition wall 350.

The first light-emitting element ED1 emits light around the region where the pixel electrode 1191, the light-emitting element layer 1370, and the common electrode 1270 overlap, and the light emission region of the first light-emitting element ED1 may overlap the pixel circuit unit PC1 connected thereto.

In the first display area DA1, the first pixel circuit unit PC1, and the first light-emitting element ED1 are disposed in a matrix form along the first direction DR1 and the second direction DR2, respectively. In this case, the first pixel circuit unit PC1 disposed in the first row and the first column is connected to and overlaps the first light-emitting element ED1 disposed in the first row and the first column. In addition, the first pixel circuit unit PC1 disposed in the first row and the second column is connected to and overlaps the first light-emitting element ED1 disposed in the first row and the second column. In addition, the first pixel circuit unit PC1 disposed in the second row and the first column is connected to and overlaps the first light-emitting element ED1 disposed in the second row and the first column. In addition, the first pixel circuit unit PC1 disposed in the second row and the second column is connected to and overlaps with the first light-emitting element ED1 disposed in the second row and the second column.

In this case, each first light-emitting element ED1 may display at least one of a first color, a second color, and a third color. In an embodiment, the first light-emitting element ED1 may display red (R), green (G), and blue (B). In this case, in the first row and the third row, the first light-emitting element ED1 displaying red (R), the first light-emitting element ED1 displaying green (G), the first light-emitting element ED1 displaying blue (B), and the first light-emitting element ED1 displaying green (G) may be repeatedly disposed. In the second row and the fourth row, the first light-emitting element ED1 displaying blue (B), the first light-emitting element ED1 displaying green (G), the first light-emitting element ED1 displaying red (R), and the first light-emitting element ED1 displaying green (G) may be repeatedly disposed.

Next, as shown in FIG. 3 and FIG. 5, the light emission region of the second light-emitting element ED2 of the display device in an embodiment does not overlap the second pixel circuit unit PC2 connected to the second light-emitting element ED2.

The second pixel circuit unit PC2 may include a semiconductor 2130, a gate electrode 2151, a source electrode 2173, and a drain electrode 2175 disposed on the substrate 110.

The buffer layer 111 may be disposed on the substrate 110, and the semiconductor 2130 of the second pixel circuit unit PC2 may be disposed on the buffer layer 111. The semiconductor 2130 of the second pixel circuit unit PC2 may be disposed in the semiconductor layer.

The gate insulating layer 140 may be disposed on the semiconductor 2130 of the second pixel circuit unit PC2, and the gate electrode 2151 of the second pixel circuit unit PC2 may be disposed on the gate insulating layer 140. The gate electrode 2151 of the second pixel circuit unit PC2 may be disposed on the gate conductive layer. The gate electrode 2151 of the second pixel circuit unit PC2 may overlap the channel 2132 of the semiconductor 2130.

The inter-insulating layer 160 may be disposed on the gate electrode 2151 of the second pixel circuit unit PC2, and the source electrode 2173 and the drain electrode 2175 of the second pixel circuit unit PC2 may be disposed on the inter-insulating layer 160. The source electrode 2173 and the drain electrode 2175 of the second pixel circuit unit PC2 may be disposed on the data conductive layer.

An opening 2161 overlapping the source electrode 2173 of the second pixel circuit unit PC2 and the first region 2131 of the semiconductor 2130 may be defined in the inter-insulating layer 160. The source electrode 2173 of the second pixel circuit unit PC2 may be connected to the first region 2131 of the semiconductor 2130 through the opening 2161. An opening 2162 overlapping the drain electrode 2175 of the second pixel circuit unit PC2 and the second region 2133 of the semiconductor 2130 may be defined in the inter-insulating layer 160. The drain electrode 2175 of the second pixel circuit unit PC2 may be connected to the second region 2133 of the semiconductor 2130 through the opening 2162.

The passivation layer 180 may be disposed on the source electrode 2173 and the drain electrode 2175 of the second pixel circuit unit PC2.

On the passivation layer 180, the second light-emitting element ED2 connected to the second pixel circuit unit PC2 may be disposed. The second light-emitting element ED2 may include a pixel electrode 2191, a light-emitting element layer 2370, and a common electrode 2270.

The pixel electrode 2191 of the second light-emitting element ED2 may be disposed above the passivation layer 180. An opening 2181 overlapping the pixel electrode 2191 and the drain electrode 2175 of the second pixel circuit unit PC2 may be defined in the passivation layer 180. The pixel electrode 2191 of the second light-emitting element ED2 may be connected to the drain electrode 2175 of the second pixel circuit unit PC2 through the opening 2181.

The partition wall 350 may be disposed on the pixel electrode 2191 of the second light-emitting element ED2. The pixel opening 2351 is defined in the partition wall 350, and the pixel opening 2351 of the partition wall 350 may overlap the pixel electrode 2191.

The light-emitting element layer 2370 of the second light-emitting element ED2 may be disposed within the pixel opening 2351 of the partition wall 350. The light-emitting element layer 2370 may overlap the pixel electrode 2191.

The common electrode 2270 may be disposed on the light-emitting element layer 2370 and the partition wall 350. The common electrode 2270 of the second light-emitting element ED2 and the common electrode 1270 of the first light-emitting element ED1 may be unitary and may be disposed entirely in most regions on the substrate 110.

The second light-emitting element ED2 emits light around the region where the pixel electrode 2191, the light-emitting element layer 2370, and the common electrode 2270 overlap, and the light emission region of the second light-emitting element ED2 does not overlap the pixel circuit unit PC2 connected thereto.

In the second display area DA2, the second pixel circuit unit PC2 and the second light-emitting element ED2 are disposed in a matrix form along the first direction DR1 and the second direction DR2, respectively. In this case, the second pixel circuit unit PC2 disposed in the first row and the first column is connected to the second light-emitting element ED2 disposed in the first row and the first column, but hardly overlap. In the part where the second pixel circuit unit PC2 and the second light-emitting element ED2 are connected to each other, only a part of the pixel electrode 2191 overlaps the second pixel circuit unit PC2, and the light-emitting element layer 2370 and the common electrode 2270 do not overlap the second pixel circuit unit PC2 at all. Therefore, the light emission region of the second light-emitting element ED2 may not overlap the second pixel circuit unit PC2 connected thereto. For the connection of the second pixel circuit unit PC2 and the second light-emitting element ED2, the pixel electrode 2191 may be extended approximately along the first direction DR1. However, the invention is not limited thereto, and the display device in an embodiment may further include a separate connection electrode for connecting the second pixel circuit unit PC2 and the second light-emitting element ED2.

In addition, the second pixel circuit unit PC2 disposed in the first row and the second column is connected to the second light-emitting element ED2 disposed in the first row and the second column, but the light emission region of the second light-emitting element ED2 does not overlap the pixel circuit unit PC2 connected thereto. In addition, the second pixel circuit unit PC2 disposed in the second row and the first column is connected to the second light-emitting element ED2 disposed in the second row and the first column, but the light emission region of the second light-emitting element ED2 does not overlap the pixel circuit unit PC2 connected thereto. In addition, the second pixel circuit unit PC2 disposed in the second row and the second column is connected to the second light-emitting element ED2 disposed in the second row and the second column, but the light emission region of the second light-emitting element ED2 does not overlap the pixel circuit unit PC2 connected thereto.

However, some light emission regions of the second light-emitting element ED2 may overlap the second pixel circuit unit PC2 that is not connected thereto. In an embodiment, the light emission region of the second light-emitting element ED2 disposed in the first row and the fourth column may overlap the second pixel circuit unit PC2 disposed in the first row and the first column, for example. In addition, the light emission region of the second light-emitting element ED2 disposed in the first row and the fifth column may overlap the second pixel circuit unit PC2 disposed in the first row and the third column. In addition, the light emission region of the second light-emitting element ED2 disposed in the first row and the sixth column may overlap the second pixel circuit unit PC2 disposed in the first row and the fifth column.

In addition, some light emission regions of the second light-emitting element ED2 may overlap the second pixel circuit unit PC2 connected thereto. In an embodiment, the light emission region of the second light-emitting element ED2 disposed in the second row and the sixth column may overlap the second pixel circuit unit PC2 disposed in the second row and the sixth column, for example.

In this case, each second light-emitting element ED2 may display at least one of a first color, a second color, and a third color. In an embodiment, the second light-emitting element ED2 may display red (R), green (G), and blue (B), for example. In this case, in the first row and the third row, the second light-emitting element ED2 displaying red (R), the second light-emitting element ED2 displaying green (G), the second light-emitting element ED2 displaying blue (B), and the second light-emitting element ED2 displaying green (G) may be repeatedly disposed. In the second row and the fourth row, the second light-emitting element ED2 displaying blue (B), the second light-emitting element ED2 displaying green (G), the second light-emitting element ED2 displaying red (R), and the second light-emitting element ED2 displaying green (G) may be repeatedly disposed. That is, the arrangement form of the second light-emitting element ED2 may be the same as the arrangement form of the first light-emitting element ED1.

In an embodiment of the display device, the second light-emitting element ED2 is disposed not only in a region in which the second pixel circuit unit PC2 is disposed, but also in a region in which the driving circuit unit is disposed, thereby extending a region in which a screen is displayed. Accordingly, the pixel density in the second display area DA2 may be relatively low compared to the pixel density in the first display area DA1. In this case, in order to compensate the lowered pixel density, the size of the second light-emitting element ED2 may be increased to increase the luminance of the second light-emitting element ED2. Accordingly, in order to supply more current to the second light-emitting element ED2, the size of each element included in the second pixel circuit unit PC2 may be increased. That is, the area occupied by the second pixel circuit unit PC2 may be widened. In an embodiment, the area of the second pixel circuit unit PC2 may be about twice the area of the first pixel circuit unit PC1, for example. In this case, the area of the second light-emitting element ED2 may be about twice the area of the first light-emitting element ED1. However, this is only an example, and the areas of the second pixel circuit unit PC2 and the second light-emitting element ED2 may be variously set.

The first pixel circuit unit PC1 and the second pixel circuit unit PC2 may be connected to a plurality of signal lines to receive the signals for driving each pixel. In an embodiment, the first pixel circuit unit PC1 may be connected to the scan line, the data line, the driving voltage line, or the like, and the second pixel circuit unit PC2 may be connected to the scan line, the dummy data line, and the driving voltage line, for example. Hereinafter, a connection relationship of the first pixel circuit unit PC1 and the second pixel circuit unit PC2, and the signal lines of the display device in an embodiment, is described with reference to FIG. 6 and FIG. 7.

Figure 6:
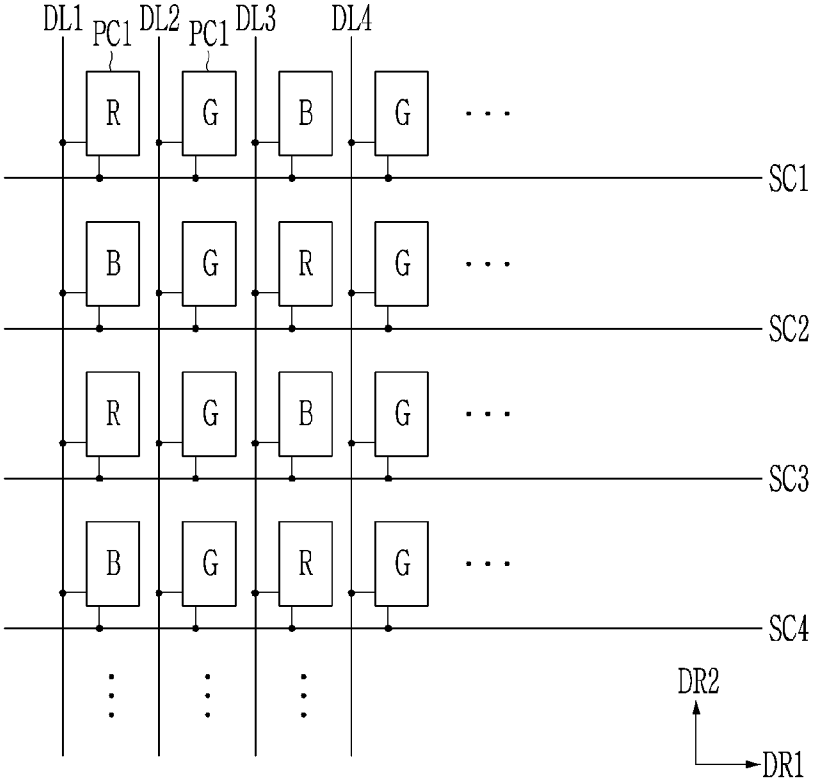
FIG. 6 is a view showing an embodiment of a connection relationship of a first pixel circuit unit and signal lines of a display device.
Figure 7:
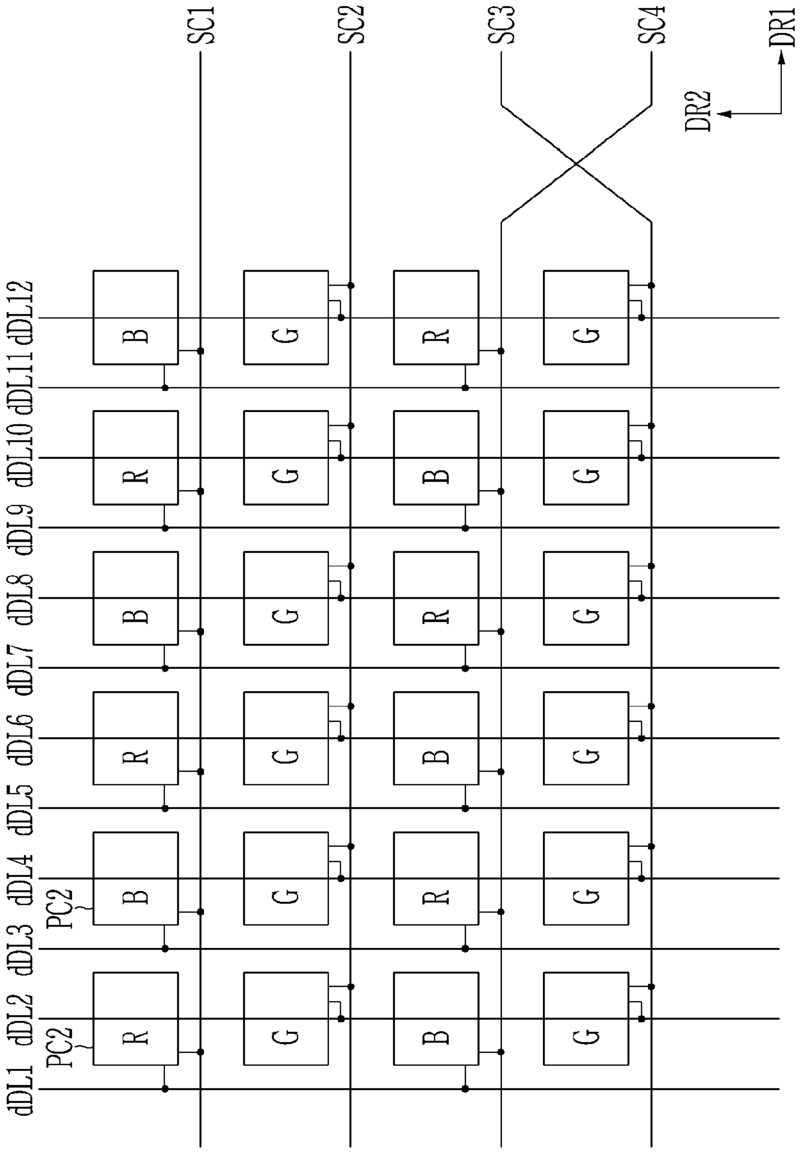
FIG. 7 is a view showing an embodiment of a connection relationship of a second pixel circuit unit and signal lines of a display device.

FIG. 6 is a view showing an embodiment of a connection relationship of a first pixel circuit unit and signal lines of a display device, and FIG. 7 is a view showing an embodiment of a connection relationship of a second pixel circuit unit and signal lines of a display device.

First, as shown in FIG. 6, the display device in an embodiment includes a plurality of first pixel circuit units PC1 disposed in a matrix form along the first direction DR1 and the second direction DR2.

Also, the display device in an embodiment further includes a plurality of scan lines SC1, SC2, SC3, and SC4) extending along the first direction DR1 and a plurality of data lines DL1, DL2, DL3, and DL4 extending along the second direction DR2. FIG. 6 only shows four scan lines C1, SC2, SC3, and SC4 and four data lines DL1, DL2, DL3, and DL4, however the number of the scan lines SC1, SC2, SC3, and SC4 and the data lines DL1, DL2, DL3, and DL4 may be variously changed.

The scan lines SC1, SC2, SC3, and SC4 may include a first scan line SC1, a second scan line SC2, a third scan line SC3, and a fourth scan line SC4 that are sequentially disposed. The first scan line SC1 is connected to the first pixel circuit unit PC1 disposed in the first row, and the second scan line SC2 is connected to the first pixel circuit unit PC1 disposed in the second row. The third scan line SC3 is connected to the first pixel circuit unit PC1 disposed in the third row, and the fourth scan line SC4 is connected to the first pixel circuit unit PC1 disposed in the fourth row.

The data lines DL1, DL2, DL3, and DL4 may include a first data line DL1, a second data line DL2, a third data line DL3, and a fourth data line DL4 that are sequentially disposed. The data signals of red (R) and blue (B) are alternately input to the first data line DL1, and the first data line DL1 is connected to the first pixel circuit unit PC1 disposed in the first column. Accordingly, in the first column, the first pixel circuit unit PC1 of the red (R) pixel and the first pixel circuit unit PC1 of the blue (B) pixel may be alternately disposed. The green (G) data signal is applied to the second data line DL2, and the second data line DL2 is connected to the first pixel circuit unit PC1 disposed in the second column. Therefore, the first pixel circuit unit PC1 of the green (G) pixel may be disposed in the second column. The data signals of blue (B) and red (R) are alternately input to the third data line DL3, and the third data line DL3 is connected to the first pixel circuit unit PC1 disposed in the third column. Therefore, in the third column, the first pixel circuit unit PC1 of the blue (B) pixel and the first pixel circuit unit PC1 of the red (R) pixel may be alternately disposed. The green (G) data signal is applied to the fourth data line DL4, and the fourth data line DL4 is connected to the first pixel circuit unit PC1 disposed in the fourth column. Therefore, the first pixel circuit unit PC1 of the green (G) pixel may be disposed in the fourth column.

Next, as shown in FIG. 7, the display device in an embodiment includes a plurality of second pixel circuit units PC2 disposed in a matrix form along the first direction DR1 and the second direction DR2.

Also, the display device in an embodiment may further include a plurality of dummy data lines dDL1, dDL2, dDL3, dDL4, dDL5, dDL6, dDL7, dDL8, dDL9, dDL10, dDL11, and dDL12 extending along the second direction DR2. FIG. 7 only shows twelve dummy data lines dDL1, dDL2, dDL3, dDL4, dDL5, dDL6, dDL7, dDL8, dDL9, dDL10, dDL11, and dDL12, however the number of the dummy data lines dDL1, dDL2, dDL3, dDL4, dDL5, dDL6, dDL7, dDL8, dDL9, dDL10, dDL11, and dDL12 may be variously changed.

A plurality of scan lines SC1, SC2, SC3, and SC4 connected to the first pixel circuit unit PC1 may also be connected to the second pixel circuit unit PC2.

The first scan line SC1 is connected to the second pixel circuit unit PC2 disposed in the first row, and the second scan line SC2 is connected to the second pixel circuit unit PC2 disposed in the second row. The third scan line SC3 is not connected to the second pixel circuit unit PC2 disposed in the third row, but is connected to the second pixel circuit unit PC2 disposed in the fourth row. The fourth scan line SC4 is not connected to the second pixel circuit unit PC2 disposed in the fourth row, but is connected to the second pixel circuit unit PC2 disposed in the third row.

The dummy data lines dDL1, dDL2, dDL3, dDL4, dDL5, dDL6, dDL7, dDL8, dDL9, dDL10, dDL11, and dDL12 may include a first dummy data line dDL1, a second dummy data line dDL2, a third dummy data line dDL3, a fourth dummy data line dDL4, a fifth dummy data line dDL5, a sixth dummy data line dDL6, a seventh dummy data line dDL7, an eighth dummy data line dDL8, a ninth dummy data line dDL9, a tenth dummy data line dDL10, an eleventh dummy data line dDL11, a twelfth dummy data line dDL12 that are sequentially disposed. The odd numbered dummy data lines dDL1, dDL3, dDL5, dDL7, dDL9, and dDL11 may be connected to the second pixel circuit unit PC2 disposed in the first row and the third row, and the even numbered dummy data lines dDL2, dDL4, dDL6, dDL8, dDL10, and dDL12 may be connected to the second pixel circuit unit PC2 disposed in the second row and the fourth row.

The second pixel circuit unit PC2 disposed in the first column is alternately connected to the first dummy data line dDL1 and the second dummy data line dDL2. The red (R) and blue (B) data signals are alternately applied to the first dummy data line dDL1, and the green (G) data signal is applied to the second dummy data line dDL2. In a reference example of the display device in which the third scan line SC3 is connected to the second pixel circuit unit PC2 disposed in the third row, the fourth scan line SC4 is connected to the second pixel circuit unit PC2 disposed in the fourth row. In this case, all of the second pixel circuit units PC2 connected to the first dummy data line dDL1 may be included in the red (R) pixel. In an embodiment of the display device, as the third scan line SC3 is connected to the second pixel circuit unit PC2 disposed in the fourth row, the fourth scan line SC4 is connected to the second pixel circuit unit PC2 disposed in the third row, and the second pixel circuit unit PC2 connected to the first dummy data line dDL1 may be alternately disposed in the red (R) and blue (B) pixels. Therefore, the pixels disposed in the first column may be disposed in the order of the red (R), green (G), blue (B), and green (G) pixels.

The second pixel circuit unit PC2 disposed in the second column is alternately connected to the third dummy data line dDL3 and the fourth dummy data line dDL4. The blue (B) and red (R) data signals are alternately applied to the third dummy data line dDL3, and the green (G) data signal is applied to the fourth dummy data line dDL4. In a reference example of the display device in which the third scan line SC3 is connected to the second pixel circuit unit PC2 disposed in the third row, and the fourth scan line SC4 is connected to the second pixel circuit unit PC2 disposed in the fourth row, all of the second pixel circuit units PC2 connected to the third dummy data line dDL3 may be included in the blue (B) pixel. In an embodiment of the display device, as the third scan line SC3 is connected to the second pixel circuit unit PC2 disposed in the fourth row, and the fourth scan line SC4 is connected to the second pixel circuit unit PC2 disposed in the third row, the dummy data line dDL3 connected to the second pixel circuit unit PC2 may be alternately disposed in the blue (B) and red (R) pixels. Therefore, the pixels disposed in the second column may be disposed in the order of the blue (B), green (G), red (R), and green (G) pixels.

Likewise, the second pixel circuit unit PC2 disposed in the third column is alternately connected to the fifth dummy data line dDL5 and the sixth dummy data line dDL6, and the data signals of the red (R) and blue (B) are alternately applied to the fifth dummy data line dDL5, and the green (G) data signal is applied to the sixth dummy data line dDL6. Therefore, the pixels disposed in the third column may be disposed in the order of red (R), green (G), blue (B), green (G) pixels. The second pixel circuit unit PC2 disposed in the fourth column is alternately connected to the seventh dummy data line dDL7 and the eighth dummy data line dDL8. The blue (B) and red (R) data signals are alternately applied to the seventh dummy data line dDL7, and the green (G) data signal is applied to the eighth dummy data line dDL8. Therefore, the pixels disposed in the fourth column may be disposed in the order of blue (B), green (G), red (R), and green (G) pixels.

In addition, the second pixel circuit unit PC2 disposed in the fifth column is alternately connected to the ninth dummy data line dDL9 and the tenth dummy data line dDL10, the red (R) and blue (B) data signals are alternately applied to the ninth dummy data line dDL9, and the green (G) data signal is applied to the tenth dummy data line dDL10. Therefore, the pixels disposed in the fifth column may be disposed in the order of the red (R), green (G), blue (B), and green (G) pixels. The second pixel circuit unit PC2 disposed in the sixth column is alternately connected to the eleventh dummy data line dDL11 and the twelfth dummy data line dDL12. The blue (B) and red (R) data signals are alternately applied to the eleventh dummy data line dDL11, and the green (G) data signal is applied to the twelfth dummy data line dDL12. Therefore, the pixels disposed in the sixth column may be disposed in the order of the blue (B), green (G), red (R), and green (G) pixels.

As described above, in an embodiment of the display device, the third scan line SC3 is connected to the first pixel circuit unit PC1 disposed in the third row and the second pixel circuit unit PC2 disposed in the fourth row. In addition, the fourth scan line SC4 is connected to the first pixel circuit unit PC1 disposed in the fourth row and the second pixel circuit unit PC2 disposed in the third row. For this connection relationship, there may be a portion where the third scan line SC3 and the fourth scan line SC4 intersect each other at the boundary between the first display area DA1 and the second display area DA2. Next, the intersection portion of the third scan line SC3 and the fourth scan line SC4 is described with reference to FIG. 8 and FIG. 9.

Figure 8:
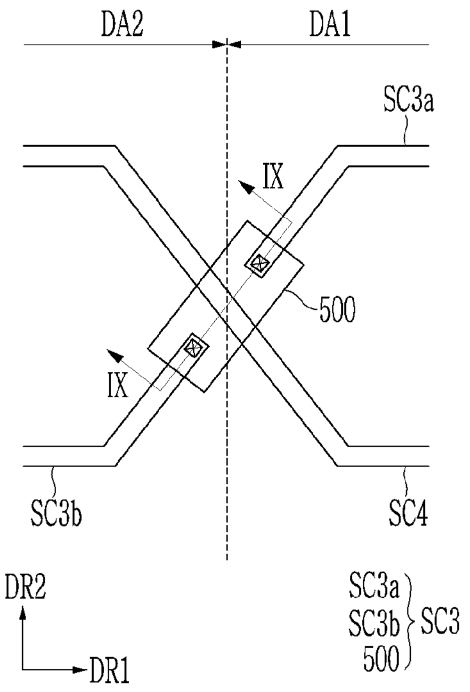
FIG. 8 is a top plan view showing an embodiment of a part of a display device.
Figure 9:
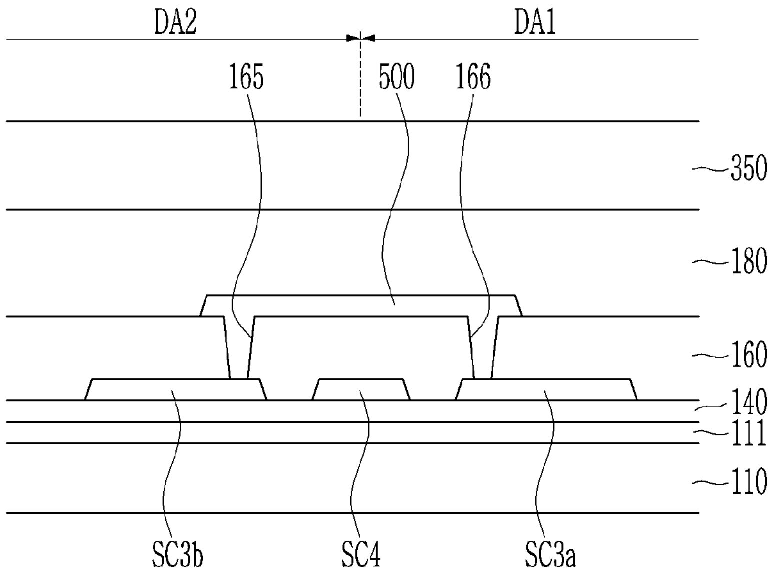
FIG. 9 is a cross-sectional view taken along line IX-IX of FIG. 8.

FIG. 8 is a top plan view showing an embodiment of a part of a display device, and FIG. 9 is a cross-sectional view taken along line IX-IX of FIG. 8.

As shown in FIG. 8 and FIG. 9, the third scan line SC3 and the fourth scan line SC4 of the display device in an embodiment may intersect on the boundary between the first display area DA1 and the second display area DA2. However, it is not limited thereto, and the intersection portion of the third scan line SC3 and the fourth scan line SC4 may be disposed only within the first display area DA1 or within the second display area DA2.

The third scan line SC3 may include a first portion SC3*a*, a second portion SC3*b*, and a connection portion 500. The first portion SC3*a* of the third scan line SC3 may be disposed in the first display area DA1, and the second portion SC3*b* may be disposed in the second display area DA2. The first portion SC3*a* and the second portion SC3*b* of the third scan line SC3 may be disposed in the gate conductive layer. The connection portion 500 of the third scan line SC3 may be disposed at the boundary between the first display area DA1 and the second display area DA2. The connection portion 500 of the third scan line SC3 may be disposed on the data conductive layer. The connection portion 500 of the third scan line SC3 may overlap an end of the first portion SC3*a* and an end of the second portion SC3*b*. The inter-insulating layer 160 may be disposed between the connection portion 500 of the third scan line SC3 and the first portion SC3*a*. An opening 166 overlapping the connection portion 500 of the third scan line SC3 and the first portion SC3*a* may be defined in the inter-insulating layer 160. The connection portion 500 of the third scan line SC3 may be connected to the first portion SC3*a* through the opening 166. The inter-insulating layer 160 may be disposed between the connection portion 500 of the third scan line SC3 and the second portion SC3*b*. An opening 165 overlapping the connection portion 500 of the third scan line SC3 and the second portion SC3*b* may be defined in the inter-insulating layer 160. The connection portion 500 of the third scan line SC3 may be connected to the second portion SC3*b* through the opening 165. Thus, the first portion SC3*a* of the third scan line SC3 and the second portion SC3*b* may be connected by the connection portion 500.

The fourth scan line SC4 extends from the first display area DA1 and may extend up to the second display area DA2. The fourth scan line SC4 may be disposed in the gate conductive layer. The fourth scan line SC4 may intersect the third scan line SC3 in an X-shape at the boundary between the first display area DA1 and the second display area DA2. In this case, at the intersection point, the fourth scan line SC4 may overlap the connection portion 500 of the third scan line SC3. The fourth scan line SC4 may be spaced at a predetermined interval from the first portion SC3*a* and the second portion SC3*b* of the third scan line SC3, and thus, it is possible to prevent the fourth scan line SC4 from being short-circuited with the third scan line SC3.

FIG. 4 and FIG. 5 show the connection relationship between one of the transistors included in the first pixel circuit unit PC1 and the second pixel circuit unit PC2, and the first light-emitting element ED1 and the second light-emitting element ED2, but at least one of the first pixel circuit unit PC1 and the second pixel circuit unit PC2 may include a plurality of transistors. Next, embodiments of a plurality of transistors included in each of the first pixel circuit unit PC1 and the second pixel circuit unit PC2 are described with reference to FIG. 10.

Figure 10:
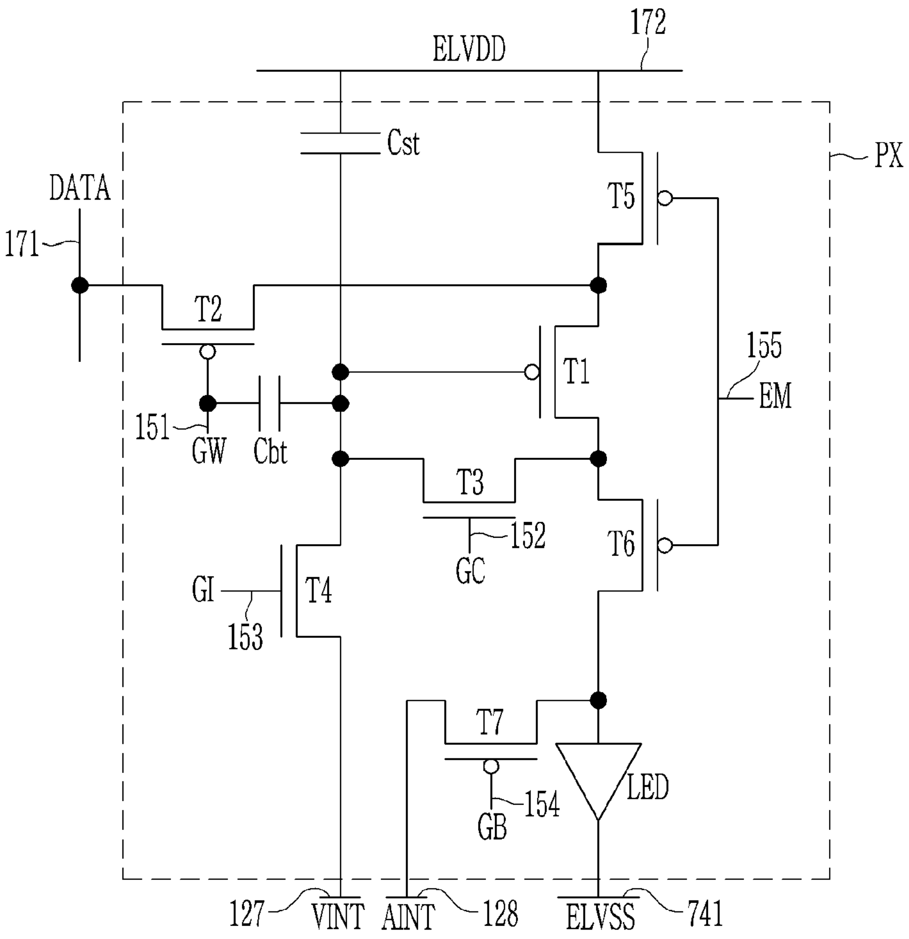
FIG. 10 is a circuit diagram of an embodiment of a display device.

FIG. 10 is a circuit diagram of a display device.

As shown in FIG. 10, one pixel PX of the display device in an embodiment includes a plurality of transistors T1, T2, T3, T4, T5, T6, and T7, a storage capacitor Cst, a boost capacitor Cbt, and a light emitting diode LED, which are connected to several wires 127, 128, 151, 152, 153, 154, 155, 171, 172, and 741.

A plurality of wires 127, 128, 151, 152, 153, 154, 155, 171, 172, and 741 is connected to one pixel PX. A plurality of wires includes a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver (not shown), and transmits the first scan signal GW to the second transistor T2. A voltage of an opposite polarity to the voltage applied to the first scan signal line 151 may be applied to the second scan signal line 152 at the same timing as the signal of the first scan signal line 151. In an embodiment, when a negative voltage is applied to the first scan signal line 151, a positive voltage may be applied to the second scan signal line 152, for example. The second scan signal line 152 transmits the second scan signal GC to the third transistor T3.

The initialization control line 153 transmits the initialization control signal GI to the fourth transistor T4. The bypass control line 154 transmits the bypass signal GB to the seventh transistor T7. The bypass control line 154 may include the first scan signal line 151 of the previous state front end. The light emission control line 155 transits the light emission control signal EM to the fifth transistor T5 and the sixth transistor T6.

The data line 171 is a wire that transmits the data voltage data generated by a data driver (not shown), and the luminance emitted by the light emitting diode LED changes according to the data voltage DATA applied to the pixel PX.

The driving voltage line 172 applies the driving voltage ELVDD. The first initialization voltage line 127 transmits the first initialization voltage VINT, and the second initialization voltage line 128 transmits the second initialization voltage AINT. The common voltage line 741 applies the common voltage ELVSS to a cathode of the light emitting diode LED. In the illustrated embodiment, the voltages applied to the driving voltage line 172, the first and second initialization voltage lines 127 and 128, and the common voltage line 741 may be constant voltages, respectively.

Hereinafter, the structure and connection relationship of a plurality of transistors is described in detail.

The driving transistor T1 may have a p-type transistor characteristic and may include a polycrystalline semiconductor. It is a transistor that adjusts the size of the current output to the anode of the light emitting diode LED according to the data voltage DATA applied to the gate electrode of the driving transistor T1. Since the brightness of the light emitting diode LED is adjusted according to the size of the driving current output to the anode of the light emitting diode LED, the luminance of the light emitting diode LED may be adjusted according to the data voltage DATA applied to the pixel PX. For this purpose, the first electrode of the driving transistor T1 is disposed to receive the driving voltage ELVDD, and is connected to the driving voltage line 172 via the fifth transistor T5. Also, the first electrode of the driving transistor T1 is connected to the second electrode of the second transistor T2 to receive the data voltage DATA. The second electrode of the driving transistor T1 is disposed so as to output the current toward the light emitting diode LED, and is connected to the anode of the light emitting diode LED via the sixth transistor T6. Also, the second electrode of the driving transistor T1 transmits the data voltage DATA applied to the first electrode to the third transistor T3. The gate electrode of the driving transistor T1 is connected to one electrode (hereinafter referred to as a second storage electrode) of the storage capacitor Cst. Therefore, the voltage of the gate electrode of the driving transistor T1 changes according to the voltage stored in the storage capacitor Cst, and accordingly the driving current output by the driving transistor T1 changes. In addition, the storage capacitor Cst serves to keep the voltage of the gate electrode of the driving transistor T1 constant for one frame.

The second transistor T2 may have a p-type transistor characteristic, and may include a polycrystalline semiconductor. The second transistor T2 is a transistor that accepts the data voltage DATA into the pixel PX. The gate electrode of the second transistor T2 is connected to the first scan signal line 151 and one electrode (hereinafter also referred to as 'a lower boost electrode') of the boost capacitor Cbt. The first electrode of the second transistor T2 is connected to the data line 171. The second electrode of the second transistor T2 is connected to the first electrode of the driving transistor T1. When the second transistor T2 is turned on by a negative voltage of the first scan signal GW transmitted through the first scan signal line 151, the data voltage DATA transmitted through the data line 171 is transmitted to the first electrode of the driving transistor T1.

The third transistor T3 may have an n-type transistor characteristic and may include an oxide semiconductor. The third transistor T3 is electrically connected to the second electrode of the driving transistor T1 and the gate electrode of the driving transistor T1. As a result, it is a transistor that transmits a compensation voltage of which the data voltage DATA is changed through the driving transistor T1 to the second storage electrode of the storage capacitor Cst. The gate electrode of the third transistor T3 is connected to the second scan signal line 152, and the first electrode of the third transistor T3 is connected to the second electrode of the driving transistor T1. The second electrode of the third transistor T3 is connected to the second storage electrode of the storage capacitor Cst, and the gate electrode of the driving transistor T1 and the other electrode (hereinafter referred to as 'an upper boost electrode') of the boost capacitor Cbt. The third transistor T3 is turned on by a positive voltage of the second scan signal GC transmitted through the second scan signal line 152, so that the gate electrode of the driving transistor T1 and the second electrode of the driving transistor T1 are connected and the voltage applied to the gate electrode of the driving transistor T1 is transmitted to the second storage electrode of the storage capacitor Cst to be stored in the storage capacitor Cst.

The fourth transistor T4 may have an n-type transistor characteristic and may include an oxide semiconductor. The fourth transistor T4 serves to initialize the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second storage electrode of the storage capacitor Cst, the gate electrode of the driving transistor T1, and the upper boost electrode via the second electrode of the third transistor T3. The fourth transistor T4 is turned on by a positive voltage of the initialization control signal GI transmitted through the initialization control line 153, and at this time, the first initialization voltage VINT is transmitted to the gate electrode of the driving transistor T1 and the second storage electrode of the storage capacitor Cst. Accordingly, the voltage of the gate electrode of the driving transistor T1 and the storage capacitor Cst are initialized.

The fifth transistor T5 may have a p-type transistor characteristic and may include a polycrystalline semiconductor. The fifth transistor T5 serves to transmit the driving voltage ELVDD to the driving transistor T1. The gate electrode of the fifth transistor T5 is connected to the light emission control line 155, the first electrode of the fifth transistor T5 is connected to the driving voltage line 172, and the second electrode of the fifth transistor T5 is connected to the first electrode of the driving transistor T1.

The sixth transistor T6 may have a p-type transistor characteristic and may include a polycrystalline semiconductor. The sixth transistor T6 serves to transmit the driving current output from the driving transistor T1 to the light-emitting element LED. The gate electrode of the sixth transistor T6 is connected to the light emission control line 155, the first electrode of the sixth transistor T6 is connected to the second electrode of the driving transistor T1, and the second electrode of the sixth transistor T6 is connected to the anode of the light-emitting element LED.

The seventh transistor T7 may have a p-type transistor characteristic and may include a polycrystalline semiconductor. The seventh transistor T7 serves to initialize the anode of the light-emitting element LED. The gate electrode of the seventh transistor T7 is connected to the bypass control line 154, the first electrode of the seventh transistor T7 is connected to the anode of the light-emitting element LED, and the second electrode of the seventh transistor T7 is connected to the second initialization voltage line 128. When the seventh transistor T7 is turned on by a negative voltage of the bypass signal GB, the second initialization voltage AINT is applied to the anode of the light-emitting element LED to be initialized.

In the above, it has been described that one pixel PX includes seven transistors T1 to T7, one storage capacitor Cst, and one boost capacitor Cbt, but is not limited thereto, and the number of transistors and capacitors and their connection relationships may be changed in many ways.

In the embodiment, the driving transistor T1 may include a polycrystalline semiconductor. Also, the third transistor T3 and the fourth transistor T4 may include an oxide semiconductor. The second transistor T2, the fifth transistor T5, the sixth transistor T6, and the seventh transistor T7 may include a polycrystalline semiconductor. However, the invention is not limited thereto, and at least one of the second transistor T2, the fifth transistor T5, the sixth transistor T6, and the seventh transistor T7 may include an oxide semiconductor. In the embodiment, by making the third transistor T3 and the fourth transistor T4 include a different semiconductor material from that of the driving transistor T1, it is possible to drive them more stably and improve reliability.

Next, the display device in an embodiment is described with reference to FIG. 11.

Figure 11:
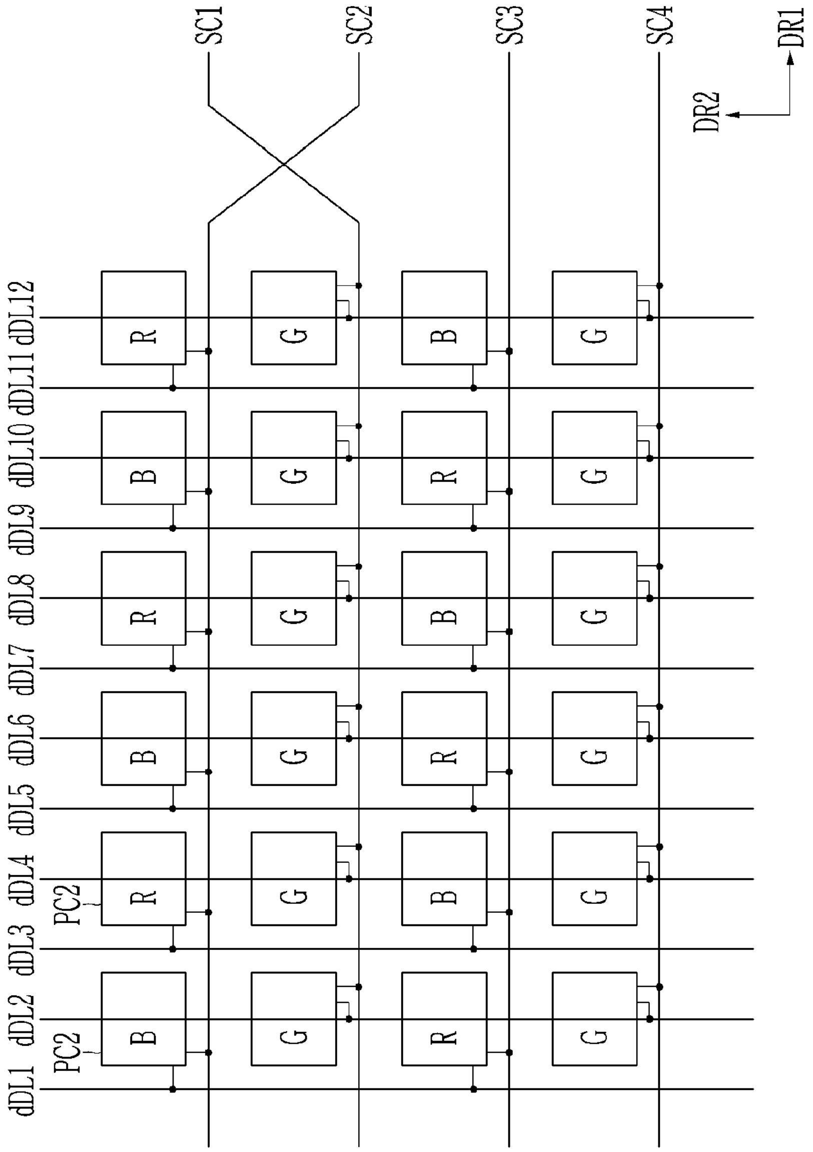
FIG. 11 is a view showing an embodiment of a connection relationship of a second pixel circuit unit and signal lines of a display device.

The display device in the embodiment shown in FIG. 11 is substantially the same as the display device in the embodiment shown in FIG. 1 to FIG. 10 so that a description of the same parts is omitted. In the embodiment, the connection relationship between the scan lines and the second pixel circuit unit is different from the previous embodiment and is further described below.

FIG. 11 is a view showing an embodiment of a connection relation of a second pixel circuit unit and signal lines of a display device.

In an embodiment of the display device, the first pixel circuit unit is connected to the scan line and the data line, and the connection relationship is the same as that of the previous embodiment, so the description thereof is omitted.

As shown in FIG. 11, the display device in an embodiment includes a plurality of second pixel circuit units PC2 disposed in a matrix form along the first direction DR1 and the second direction DR2.

In addition, the display device in an embodiment may further include a plurality of scan lines SC1, SC2, SC3, and SC4 extended along the first direction DR1 and a plurality of dummy data lines dDL1, dDL2, dDL3, dDL4, dDL5, dDL6, dDL7, dDL8, dDL9, dDL10, dDL11, and dDL12 extended along the second direction DR2. FIG. 11 only shows twelve dummy data lines dDL1, dDL2, dDL3, dDL4, dDL5, dDL6, dDL7, dDL8, dDL9, dDL10, dDL11, and dDL12, however the number of the dummy data lines dDL1, dDL2, dDL3, dDL4, dDL5, dDL6, dDL7, dDL8, dDL9, dDL10, dDL11, and dDL12 may be variously changed.

A plurality of scan lines SC1, SC2, SC3, and SC4 connected to the first pixel circuit unit PC1 may also be connected to the second pixel circuit unit PC2.

The first scan line SC1 is not connected to the second pixel circuit unit PC2 disposed in the first row, but is connected to the second pixel circuit unit PC2 disposed in the second row. The second scan line SC2 is not connected to the second pixel circuit unit PC2 disposed in the second row, but is connected to the second pixel circuit unit PC2 disposed in the first row. The third scan line SC3 is connected to the second pixel circuit unit PC2 disposed in the third row, and the fourth scan line SC4 is connected to the second pixel circuit unit PC2 disposed in the fourth row.

The dummy data lines dDL1, dDL2, dDL3, dDL4, dDL5, dDL6, dDL7, dDL8, dDL9, dDL10, dDL11, and dDL12 may include a first dummy data line dDL1, a second dummy data line dDL2, a third dummy data line dDL3, a fourth dummy data line dDL4, a fifth dummy data line dDL5, a sixth dummy data line dDL6, a seventh dummy data line dDL7, an eighth dummy data line dDL8, a ninth dummy data line dDL9, a tenth dummy data line dDL10, an eleventh dummy data line dDL11, and a twelfth dummy data line dDL12 sequentially disposed. The odd numbered dummy data lines dDL1, dDL3, dDL5, dDL7, dDL9, and dDL11 may be connected to the second pixel circuit unit PC2 disposed in the first row and the third row, and the even numbered dummy data lines dDL2, dDL4, dDL6, dDL8, dDL10, and dDL12 may be connected to the second pixel circuit unit PC2 disposed in the second row and the fourth row.

The second pixel circuit unit PC2 disposed in the first column is alternately connected to the first dummy data line dDL1 and the second dummy data line dDL2. The red (R) and blue (B) data signals are alternately applied to the first dummy data line dDL1, and the green (G) data signal is applied to the second dummy data line dDL2. In a reference example of the display device in which the first scan line SC1 is connected to the second pixel circuit unit PC2 disposed in the first row and the second scan line SC2 is connected to the second pixel circuit unit PC2 disposed in the second row, the second pixel circuit unit PC2 connected to the first dummy data line dDL1 may be included in the red (R) pixel. In the display device in an embodiment, as the first scan line SC1 is connected to the second pixel circuit unit PC2 disposed in the second row and the second scan line SC2 is connected to the second pixel circuit unit PC2 disposed in the first row, the second pixel circuit unit PC2 connected to the dummy data line dDL1 be alternately disposed in the blue (B) and red (R) pixels. Therefore, the pixels disposed in the first column may be disposed in the order of the blue (B), green (G), red (R), and green (G) pixels.

The second pixel circuit unit PC2 disposed in the second column is alternately connected to the third dummy data line dDL3 and the fourth dummy data line dDL4. The blue (B) and red (R) data signals are alternately applied to the third dummy data line dDL3, and the green (G) data signal is applied to the fourth dummy data line dDL4. In a reference example of the display device in which the first scan line SC1 is connected to the second pixel circuit unit PC2 disposed in the first row and the second scan line SC2 is connected to the second pixel circuit unit PC2 disposed in the second row, the second pixel circuit unit PC2 connected to the third dummy data line dDL3 may be included in the blue (B) pixel. In an embodiment of the display device, as the first scan line SC1 is connected to the second pixel circuit unit PC2 disposed in the second row and the second scan line SC2 is connected to the second pixel circuit unit PC2 disposed in the first row, the second pixel circuit unit PC2 connected to the dummy data line dDL3 may be alternately disposed in the red (R) and blue (B) pixels. Therefore, the pixels disposed in the second column may be disposed in the order of the red (R), green (G), blue (B), and green (G) pixels.

Likewise, the second pixel circuit unit PC2 disposed in the third column is alternately connected to the fifth dummy data line dDL5 and the sixth dummy data line dDL6, and the data signals of red (R) and blue (B) are applied alternately to the fifth dummy data line dDL5, and the green (G) data signal is applied to the sixth dummy data line dDL6. Therefore, the pixels disposed in the third column may be disposed in the order of the blue (B), green (G), red (R), and green (G) pixels. The second pixel circuit unit PC2 disposed in the fourth column is alternately connected to the seventh dummy data line dDL7 and the eighth dummy data line dDL8. The blue (B) and red (R) data signals are alternately applied to the seventh dummy data line dDL7, and the green (G) data signal is applied to the eighth dummy data line dDL8. Therefore, the pixels disposed in the fourth column may be disposed in the order of the red (R), green (G), blue (B), and green (G) pixels.

In addition, the second pixel circuit unit PC2 disposed in the fifth column is alternately connected to the ninth dummy data line dDL9 and the tenth dummy data line dDL10, and the red (R) and blue (B) data signals are applied alternately to the ninth dummy data line dDL9, and the green (G) data signal is applied to the tenth dummy data line dDL10. Therefore, the pixels disposed in the fifth column may be disposed of in the order of the blue (B), green (G), red (R), and green (G) pixels. The second pixel circuit unit PC2 disposed in the sixth column is alternately connected to the eleventh dummy data line dDL11 and the twelfth dummy data line dDL12. The blue (B) and red (R) data signals are alternately applied to the eleventh dummy data line dDL11, and the green (G) data signal is applied to the twelfth dummy data line dDL12. Therefore, the pixels disposed in the sixth column may be disposed in the order of the red (R), green (G), blue (B), and green (G) pixels.

In an embodiment of the display device, the first scan line SC1 is connected to the first pixel circuit unit PC1 disposed in the first row and the second pixel circuit unit PC2 disposed in the second row. In addition, the second scan line SC2 is connected to the first pixel circuit unit PC1 disposed in the second row and the second pixel circuit unit PC2 disposed in the first row.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:

a substrate including a display area which provides a color image;

a plurality of scan lines disposed on the substrate;

a plurality of data lines and a plurality of dummy data lines intersecting the plurality of scan lines, each of the plurality of scan lines overlapping the display area;

a plurality of first pixel circuit units which display color image and are connected to the plurality of scan lines and the plurality of data lines;

a first light-emitting element connected to a first pixel circuit unit of the plurality of first pixel circuit units;

a plurality of second pixel circuit units connected to the plurality of scan lines and the plurality of dummy data lines; and a second light-emitting element connected to a second pixel circuit unit of the plurality of second pixel circuit units, wherein at least one of the plurality of scan lines intersects another adjacent scan line of the plurality of scan lines.

2. The display device of claim 1, wherein the substrate further includes a peripheral area, the display area includes a first display area and a second display area disposed between the first display area and the peripheral area, p1 the first pixel circuit unit and the first light-emitting element are disposed in the first display area, and the second pixel circuit unit and the second light-emitting element are disposed in the second display area.

3. The display device of claim 2, further comprising a driving circuit unit generating and transmitting a signal for driving the first light-emitting element and the second light-emitting element, at least a part of the driving circuit unit is disposed in the second display area, and a remaining part of the driving circuit unit is disposed in the peripheral area.

4. The display device of claim 3, wherein the second light-emitting element overlaps the driving circuit unit.

5. The display device of claim 4, wherein a light emission region of the first light-emitting element overlaps the first pixel circuit unit connected thereto, and a light emission region of at least one second light-emitting element of a plurality of second light-emitting elements does not overlap the second pixel circuit unit connected thereto.

6. The display device of claim 4, wherein a light emission region of at least one second light-emitting element of the plurality of second light-emitting elements overlaps the second pixel circuit unit which is not connected thereto.

7. The display device of claim 3, wherein the driving circuit unit includes a scan driver, a data driver, a driving voltage supply line, and a common voltage supply line, and the scan driver is disposed in the second display area.

8. The display device of claim 2, wherein the plurality of scan lines extends in a first direction, the plurality of data lines and the plurality of dummy data lines extend in a second direction intersecting the first direction, and the first pixel circuit unit and the second pixel circuit unit are disposed in a matrix form along the first direction and the second direction.

9. The display device of claim 8, wherein the plurality of scan lines includes a first scan line, a second scan line, a third scan line, and a fourth scan line, the first scan line is connected to a first pixel circuit unit disposed in a first row among the plurality of first pixel circuit units and a second pixel circuit unit disposed in the first row among the plurality of second pixel circuit units, the second scan line is connected to a first pixel circuit unit disposed in a second row among the plurality of first pixel circuit units and a second pixel circuit unit disposed in the second row among the plurality of second pixel circuit units, the third scan line is connected to a first pixel circuit unit disposed in a third row among the plurality of first pixel circuit units and a second pixel circuit unit disposed in a fourth row among the plurality of second pixel circuit units, and the fourth scan line is connected to a first pixel circuit unit disposed in the fourth row among the plurality of first pixel circuit units and a second pixel circuit unit disposed in the third row among the plurality of second pixel circuit units.

10. The display device of claim 9, wherein the third scan line and the fourth scan line intersect each other at a boundary between the first display area and the second display area.

11. The display device of claim 10, wherein the third scan line includes a first portion disposed in the first display area, a second portion disposed in the second display area, and a connection portion connecting the first portion and the second portion, and the connection portion of the third scan line overlaps the fourth scan line at the intersection of the third scan line and the fourth scan line.

12. The display device of claim 11, wherein the first portion and the second portion of the third scan line are disposed in a same layer as the fourth scan line, and the connection portion of the third scan line is disposed in a different layer from the fourth scan line.

13. The display device of claim 8, wherein the plurality of scan lines includes a first scan line, a second scan line, a third scan line, and a fourth scan line, the first scan line is connected to a first pixel circuit unit disposed in a first row among the plurality of first pixel circuit units and a second pixel circuit unit disposed in a second row among the plurality of second pixel circuit units, the second scan line is connected to a first pixel circuit unit disposed in the second row among the plurality of first pixel circuit units and a second pixel circuit unit disposed in the first row among the plurality of second pixel circuit units, the third scan line is connected to a first pixel circuit unit disposed in a third row among the plurality of first pixel circuit units and a second pixel circuit unit disposed in the third row among the plurality of second pixel circuit units, and the fourth scan line is connected to a first pixel circuit unit disposed in a fourth row among the plurality of first pixel circuit units and a second pixel circuit unit disposed in the fourth row among the plurality of second pixel circuit units.

14. The display device of claim 13, wherein the first scan line and the second scan line intersect each other at a boundary between the first display area and the second display area.

15. The display device of claim 2, wherein a size of the second light-emitting element is larger than a size of the first light-emitting element, and an area of the second pixel circuit unit is larger than an area of the first pixel circuit unit.

16. The display device of claim 15, wherein the size of the second light-emitting element is twice the size of the first light-emitting element, and the area of the second pixel circuit unit is twice the area of the first pixel circuit unit.

17. A display device comprising:

a substrate including a first display area, a peripheral area, and a second display area disposed between the first display area and the peripheral area;

a first scan line and a second scan line disposed on the substrate;

a first pixel circuit unit disposed in the first display area and connected to the first scan line or the second scan line; and a second pixel circuit unit disposed in the second display area and connected to the first scan line or the second scan line, wherein the first pixel circuit unit connected to the first scan line is disposed in a same row as the second pixel circuit unit connected to the second scan line, and the first pixel circuit unit connected to the second scan line is disposed in a same row as the second pixel circuit unit connected to the first scan line.

18. The display device of claim 17, wherein the first scan line and the second scan line intersect each other at a boundary between the first display area and the second display area.

19. The display device of claim 17, further comprising:

a first light-emitting element connected to the first pixel circuit unit; and a second light-emitting element connected to the second pixel circuit unit, a light emission region of the first light-emitting element overlaps the first pixel circuit unit connected thereto, and a light emission region of the second light-emitting element does not overlap the second pixel circuit unit connected thereto.

20. The display device of claim 19, further comprising a driving circuit unit generating and transmitting a signal for driving the first light-emitting element and the second light-emitting element, and the second light-emitting element overlaps the driving circuit unit.

21. An electronic device comprising a display device, the display device comprising:

a substrate including a display area which provides a color image;

a plurality of scan lines disposed on the substrate;

a plurality of data lines and a plurality of dummy data lines intersecting the plurality of scan lines, each of the plurality of scan lines overlapping the display area;

a plurality of first pixel circuit units which display color image and are connected to the plurality of scan lines and the plurality of data lines;

a first light-emitting element connected to a first pixel circuit unit of the plurality of first pixel circuit units;

a plurality of second pixel circuit units connected to the plurality of scan lines and the plurality of dummy data lines; and a second light-emitting element connected to a second pixel circuit unit of the plurality of second pixel circuit units, wherein at least one of the plurality of scan lines intersects another adjacent scan line of the plurality of scan lines.

22. The electronic device of claim 21, wherein the substrate further includes a peripheral area, the display area includes a first display area and a second display area disposed between the first display area and the peripheral area, the first pixel circuit unit and the first light-emitting element are disposed in the first display area, and the second pixel circuit unit and the second light-emitting element are disposed in the second display area.

* * * * *